United States Patent [19]
Sandhu et al.

[11] Patent Number: 5,124,780
[45] Date of Patent: Jun. 23, 1992

[54] CONDUCTIVE CONTACT PLUG AND A METHOD OF FORMING A CONDUCTIVE CONTACT PLUG IN AN INTEGRATED CIRCUIT USING LASER PLANARIZATION

[75] Inventors: Gurtej S. Sandhu; Chang Yu; Trung T. Doan; Mark E. Tuttle, all of Boise, Id.

[73] Assignee: Micron Technology, Inc., Boise, Id.

[21] Appl. No.: 713,187

[22] Filed: Jun. 10, 1991

[51] Int. Cl.$^5$ .................. B44C 1/22; C03C 15/00; C23F 1/00; H01L 23/48
[52] U.S. Cl. ..................... 357/67; 156/644; 156/656; 156/657; 156/659.1; 219/121.66; 357/71; 427/53.1; 437/190; 437/192; 437/194; 437/228
[58] Field of Search ............... 156/644, 650, 653, 656, 156/657, 659.1, 662; 427/53.1, 97; 219/121.65, 121.66, 121.85; 357/67, 71; 51/165; 437/188, 189, 190, 192, 194, 203, 204, 228, 238, 245, 225, 197-199

[56] References Cited
U.S. PATENT DOCUMENTS

| | | | |
|---|---|---|---|
| 4,888,087 | 12/1989 | Moslehi et al. | 156/656 X |
| 4,936,950 | 6/1990 | Doan et al. | 156/656 X |
| 4,981,550 | 1/1991 | Huttemann et al. | 156/643 |
| 4,997,518 | 3/1991 | Madokoro | 156/656 X |

OTHER PUBLICATIONS

Doan et al., "A Novel Submicron AL Contact Filling Technology for ULSI Metallization," Eighth International VLSI Multi-Layer Interconnection Conference, Jun. 11 1991.

Primary Examiner—William A. Powell
Attorney, Agent, or Firm—Susan B. Collier

[57] ABSTRACT

The invention is a method of forming a conductive contact plug and an interconnect line independent of each other. The contact plug is formed using laser planarization and a blanket etch back. The invention is also the contact plug thus formed. The contact plug and interconnect line may be fabricated with conductive materials having substantially similar methods of deposition. The integrity of the contact plug is enhanced using laser planarization.

The process begins with a wafer having a dielectric layer, the upper surface of which has been planarized. A masking step defines a contact hole. An etch creates the contact hole which passes through the dielectric layer to a conductive region where contact is to be made. A first layer of conductive material is then deposited overlying the dielectric layer. A layer of material having an anti-reflective coating (ARC) (or a layer of material having a higher boiling point than the first layer) is deposited overlying the first layer. The ARC enhances the fluidity of the first layer during a subsequent laser planarization. The first layer and ARC overlying the dielectric are then laser planarized. The laser planarization is followed by a blanket etch of the first layer and ARC. The etch forms a contact plug substantially coplanar with the surface of the dielectric layer. At this juncture a second layer of conductive material may be deposited and masked to form interconnect lines for joining contact plugs.

46 Claims, 9 Drawing Sheets

CONDUCTIVE CONTACT PLUG AND A METHOD OF FORMING A CONDUCTIVE CONTACT PLUG IN AN INTEGRATED CIRCUIT USING LASER PLANARIZATION

FIELD OF THE INVENTION

This invention relates to semiconductor manufacturing technology and, more specifically, to methods for creating metal interconnections between conductive layers and metal interconnect lines in sub-micron manufacturing processes.

BACKGROUND OF THE INVENTION

In semiconductor manufacturing fabricated electrical devices such as field-effect transistors are connected one to another by fabricated conductive lines, called interconnect lines. It is typical to interpose a vertical interconnect plug between the electrical device and the interconnect lines. This plug is called a contact plug since it is formed to contact the electrical device. The portion of the electrical device contacted by the contact plug is called the contact region. The contact plug may be formed in a hole or cavity called a contact hole. The contact plug provides an electrical coupling of the electrical device and the interconnect lines. In this discussion the contact hole is a channel formed in the semiconductor device and more particularly in a dielectric layer. The channel is formed in order to expose a conductive layer of an electrical device. A contact plug is the object formed in the contact hole when a material fills the contact hole contacting the conductive layer.

In contemporary technology the contact plug is fabricated using tungsten and the interconnect lines are fabricated using aluminum. The use of tungsten necessitates an intricate manufacturing process; one process is utilized for the tungsten deposition and subsequent etch and one process is utilized for the aluminum deposition and subsequent etch. The process is made even more complex by the additional machinery and physical areas needed to perform the distinct processes.

One alternative is the single deposition of aluminum to form the contact plug and interconnect. However step coverage is poor. A conventional laser planarization may be utilized to improve step coverage. The laser planarization comprises subjecting the aluminum to pulses of laser energy. The laser energy imparts thermal energy to the aluminum, liquefying the aluminum and planarizing the surface of the aluminum. When the laser energy is removed the aluminum solidifies. However the solid surface of the aluminum after lasing is rough in areas where laser pulses overlap and has cracks due to the recrystallization which takes place during laser assisted reflow. This aluminum is not suitable for use as interconnect lines because it is difficult to pattern and has low reliability as a conductor. An anti-reflective coating (ARC) may be deposited over the aluminum to help alleviate this problem and improve the process window. The process window is the difference in the optical fluence required for completely filling the contact hole and the optical fluence required to initiate the onset of optical ablation. Although the use of ARC results in a much smoother surface, it typically increases the resistivity of the aluminum since the ARC intermixes with the aluminum forming a composite layer. Since the ARC typically has a higher resistivity than aluminum, the composite layer also has a higher resistivity than aluminum. A higher resistivity is detrimental in the interconnect lines.

SUMMARY OF THE INVENTION

According to the invention, a semiconductor device is formed having an aluminum contact plug typified as having good step coverage due to a laser assisted reflow. Aluminum interconnect lines are fabricated subsequent to the fabrication of the contact plug.

According to a further aspect of the invention, after a contact hole is masked, the contact hole is etched. The etch is followed by a deposit of a first conductive layer. A layer of ARC is deposited to optimize a subsequent laser planarization. Although the ARC increases the resistivity of the conductive material it does not preclude the use of ARC in fabricating the contact plug. The conductive layer and ARC are subjected to a laser planarization and then etched back by either a wet etch, a dry etch, a chemical-mechanical polishing (CMP), or a combination thereof in order to expose the contact plug and the dielectric layer, the contact plug being substantially coplanar with the surface of the dielectric layer. CMP has typically been utilized in removal of dielectric layers, and its use in removing metal is novel. In the present embodiment the CMP etch provides a contact plug surface substantially coplanar with the surface of the dielectric layer. This fabricated contact plug surface is conducive for a good electrical contact with subsequently formed interconnect lines.

Next the device is cleaned in order to remove contaminants resulting from the CMP.

The cleaning is followed by a deposition of a second conductive layer. The second conductive layer is then masked and etched to form interconnect line. It is also possible to etch the trough for the interconnect line and then deposit the aluminum in the trough. This method is referred to as damascene, and is similar to damascene techniques used in other manufacturing processes.

The invention provides a method for forming contact plugs and interconnect lines using substantially equivalent materials and machinery. The method facilitates manufacturing by controlling production costs. The products are manufactured more quickly due to the duplication of process and materials used to produce both the contact plugs and the interconnect lines. Costs are also controlled directly by eliminating the use of cumbersome machinery indigenous to the manufacture of tungsten contact plugs. The same machines and the same manufacturing area may be used to produce the invention, thus simplifying the process.

The invention provides integrity of the electrical connections formed at the juncture of the contact plugs and interconnect lines.

Problems associated with the rough metal surfaces formed in areas where laser pulses overlap during laser reflow and the increase of resistivity due to the intermixing of the ARC and the metal during laser reflow are alleviated in the invention, since the interconnect metal utilized for the interconnect lines has not been subjected to a laser planarization.

The invention allows the use of metal films having different alloy compositions which can be independently optimized to fill contact holes and form interconnects, thus realizing the full potential of the laser planarization process.

This method can also widen the process window for contact hole filling by the laser reflow process since the ARC can now be used for enhancing planarization without any concern for increases in resistivity due to intermixing of the ARC with the metal.

DETAILED DESCRIPTION OF THE PREFERRED EMBODIMENT

The invention is the method of forming a contact plug by the following process and the contact plug thus formed by the process.

Figure 1:
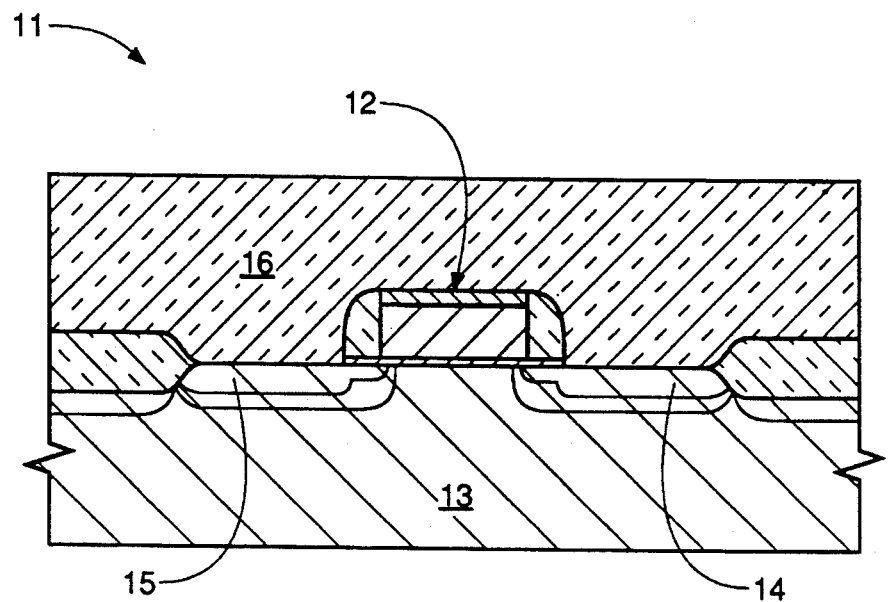
FIG. 1 is a cross sectional view of a portion of a partially-processed semiconductor wafer which depicts a field-effect transistor (FET) having as a drain a conductively-doped region within a silicon substrate, all of which is overlaid by a planarized dielectric layer of silicon dioxide.

A portion of a partially-processed semiconductor wafer 11 is shown in FIG. 1. A field-effect transistor (FET) 12 has been constructed on top of a silicon substrate 13, a portion of which has been doped to serve as the FET drain 14, and another portion of which has been doped to serve as the FET source 15. The FET 12 is just one example of a device to which an electrical connection may be made. All topography has been covered by a silicon dioxide dielectric layer 16 the upper surface of which has been planarized. The silicon dioxide may be doped with boron and/or phosphorus. In order to completely describe the present invention, it will be assumed that a contact plug must be formed through the dielectric layer 16 and that the contact plug must connect with FET drain 14 while being substantially coplanar with the surface of the dielectric layer 16.

Figure 2:
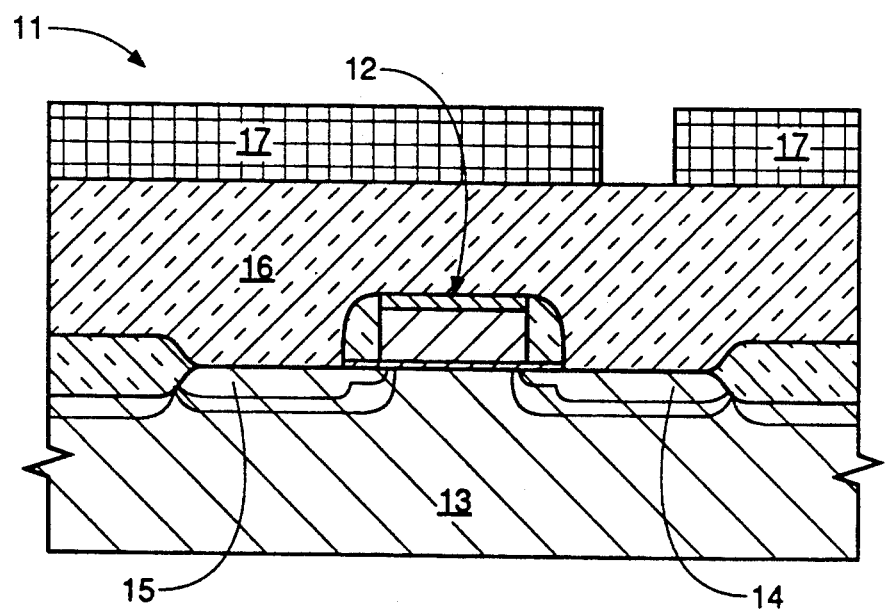
FIG. 2 is a cross sectional view of the wafer portion of FIG. 1, following a first photo masking step which defines a contact hole.

Referring now to FIG. 2, a first photoresist mask 17 has been applied to wafer 11 on top of dielectric layer 16. First photo mask 17 defines the geometries of desired contact holes 18 (shown in FIG. 3) on the surface of dielectric layer 16. Only a single contact hole will be created on the wafer portion shown in this Figure. A first dry oxide etch forms a contact hole which will be filled with a conductive metal in a later step.

Figure 3:
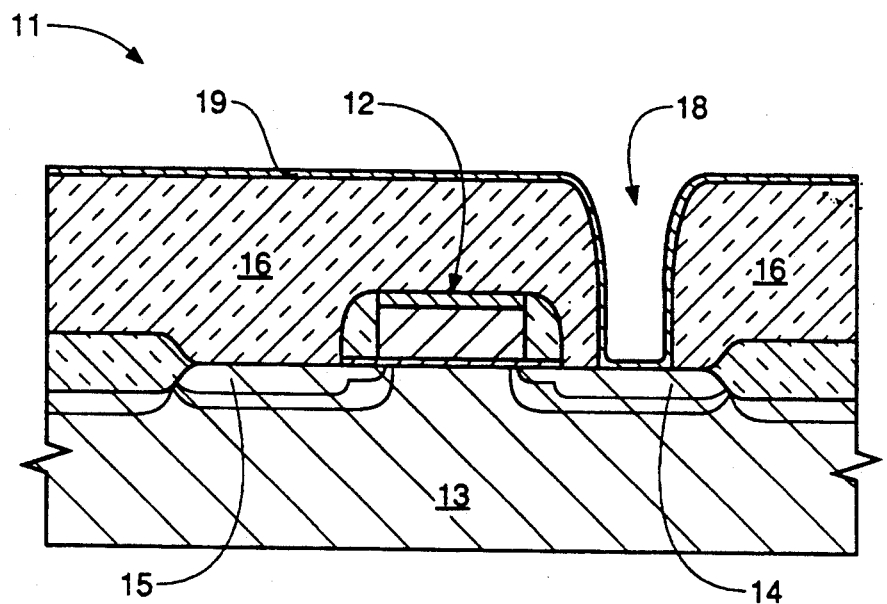
FIG. 3 is a cross sectional view of the wafer portion of FIG. 2, following a first dry oxide etch which creates the contact hole, the removal of the first photo mask, and a blanket deposition of a barrier layer.

Referring now to FIG. 3, contact hole 18 etched in dielectric layer 16 is shown following the removal of first photo mask 17. A barrier layer 19 is deposited to prevent the interaction of the dielectric layer 16 with a subsequent aluminum deposition. The barrier layer 19 may comprise titanium tungsten or titanium nitride.

Figure 4:
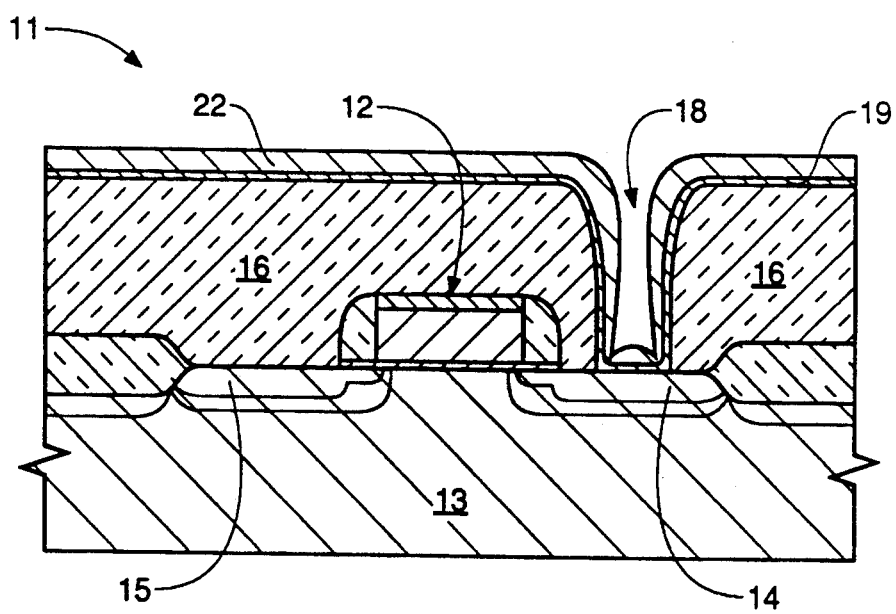
FIG. 4 is a cross sectional view of the wafer portion of FIG. 3, following a deposition of aluminum.

Referring now to FIG. 4, a layer of conductive material 22 has been deposited on top of the dielectric layer 16. In the preferred embodiment the layer of conductive material 22 is aluminum although it may comprise other metals, such as copper, gold, titanium or molybdenum. It can be seen from the drawing that contact hole 18 is not completely filled with the layer of conductive material 22. The layer of conductive material 22 adjacent to the vertical sides of the contact hole 18 has minimal contact with the layer of conductive material 22 overlying the FET drain 14 and there is a void formed near the center and top of the contact hole 18 and extending into the contact hole 18 which will result in poor electrical connections with subsequently formed interconnect lines. The transistor would be either inoperative or intermittently inoperative if no further steps were taken to improve the quality of this connection. A laser planarization may be used in order to improve the integrity of the contact plug. The planar nature of the contact plug provides a good electrical contact with subsequently formed interconnect lines.

Figure 5:
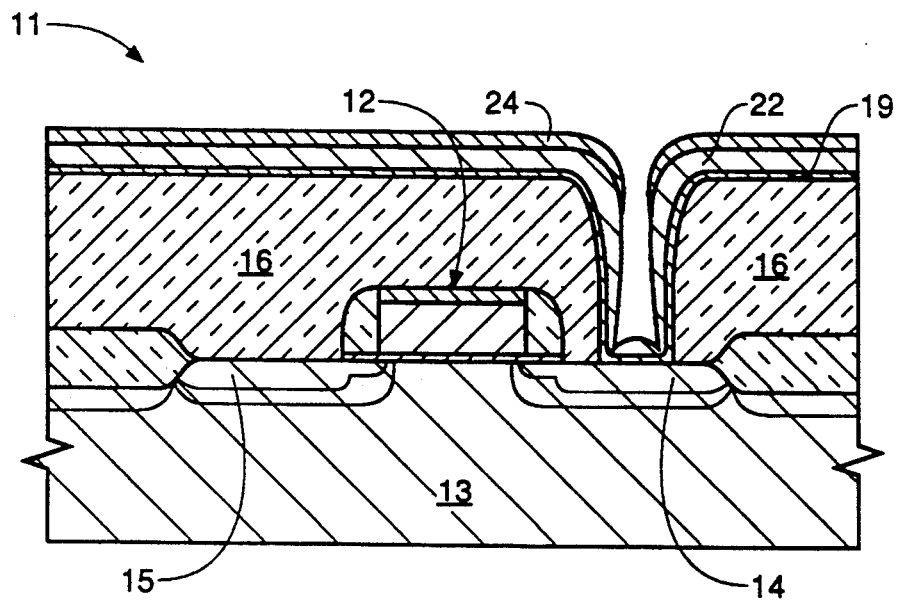
FIG. 5 is a cross sectional view of the wafer portion of FIG. 4, following a deposition of ARC.

In order to optimize the laser planarization a layer of anti-reflective coating (ARC) 24 is blanket deposited. Examples of ARC are materials that comprise titanium, titanium nitride, tungsten or tungsten nitride. The layer of ARC 24 is shown in FIG. 5 overlying the layer of conductive material 22. Since the ARC has a higher resistivity than aluminum it increases the resistivity in the aluminum when it intermixes with the aluminum. However, the lower reflectivity of the ARC provides a high boiling point which is conducive to an improved laser planarization process window. Increasing the resistivity of the aluminum has a minimal effect when confined to the contact plug, however it should be avoided when fabricating interconnect lines.

Although the barrier layer 19, the layer of conductive material 22, and the ARC 24 depositions may be accomplished by any number of means such as chemical vapor deposition or sputter deposition, sputter deposition is preferred.

Figure 6:
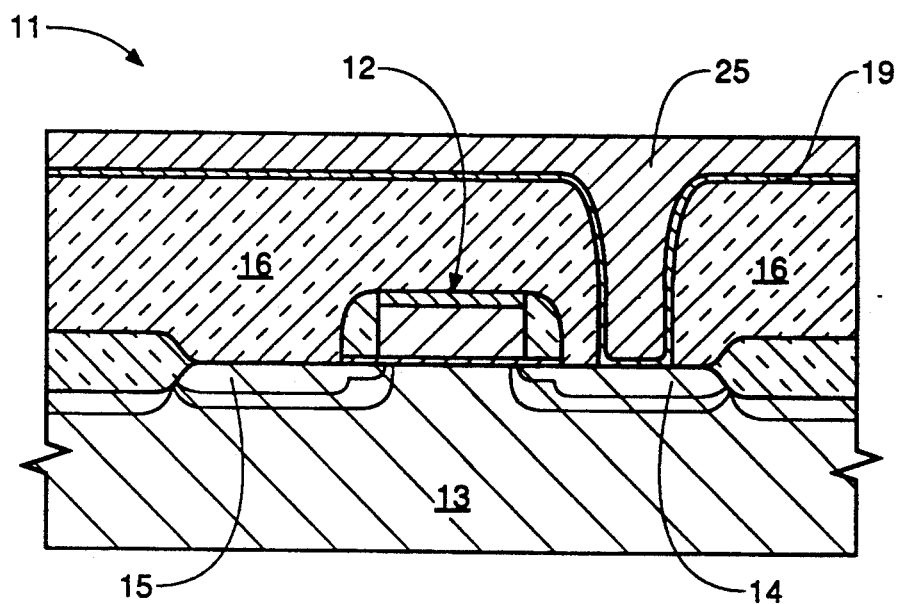
FIG. 6 is a cross sectional view of the wafer portion of FIG. 5, following a laser planarization.

FIG. 6, depicts the semiconductor wafer 11 of FIG. 5 after a laser planarization. The ARC 24 and conductive material 22 are intermixed during the laser reflow process to form a composite layer 25. The composite layer 25 is a substantially homogeneous layer formed during laser reflow and solidified subsequent to the cessation of the laser reflow. The laser planarization provides enough heat energy to flow the composite layer 25 to the extent that voids are filled, step coverage improved and surfaces planarized.

Figure 7:
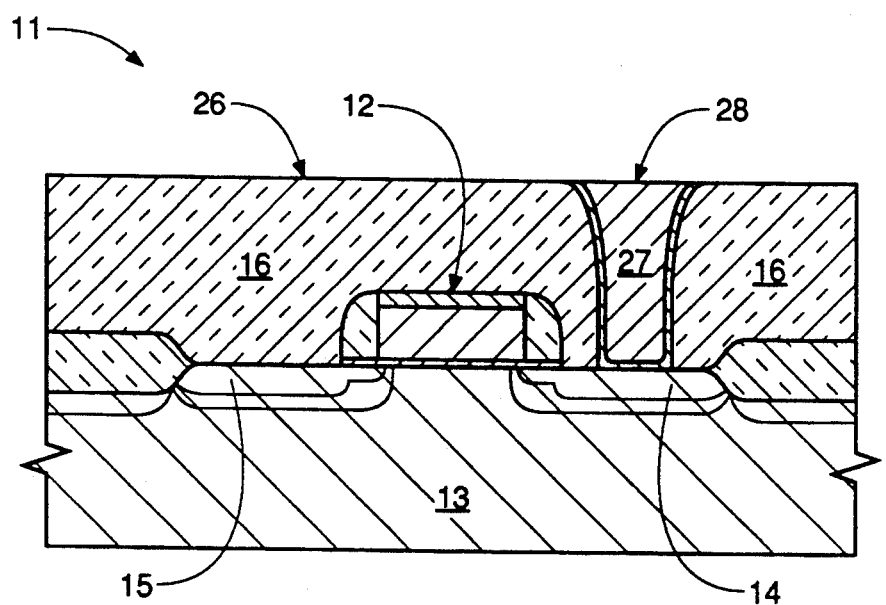
FIG. 7 is a cross sectional view of the wafer portion of FIG. 6, following the removal of the composite and barrier layers overlying the dielectric layer.
Figure 8:
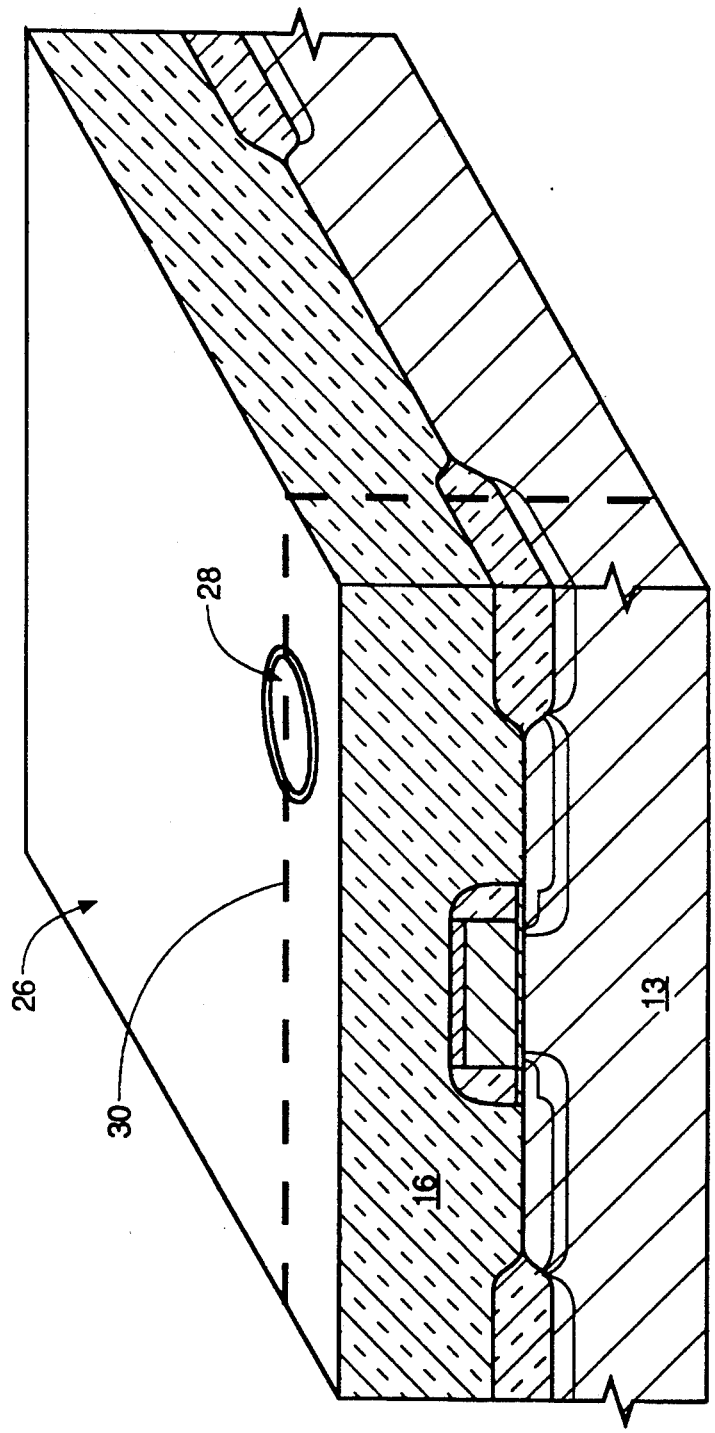
FIG. 8 is an isometric view of the wafer portion of FIG. 7, the cross section shown in FIG. 7 defined by the plane formed by the broken line in FIG. 8.

Referring now to FIG. 7 and three-dimensional FIG. 8, the composite layer 25 and barrier layer 19 has been etched to expose the surface 26 of the dielectric layer 16 and to form the contact plug 27 having a surface 28 substantially coplanar with the surface 26 of the dielectric layer 16. The plane defined by the broken lines 30 in FIG. 8 is the cross section shown in FIG. 7.

The layers have been etched using chemical-mechanical polishing (CMP). Although the etch may be a strictly chemical or a strictly mechanical, CMP is the preferred method. This method is explained in Ser. No. 07/586,996, filed Sep. 24, 1990, now U.S. Pat. No. 5,036,015, entitled "Method and Apparatus of Endpoint Detection During Mechanical Planarization of Semiconductor Wafers" and ,in copending application, Ser. No. 07/686,686, filed Apr. 17, 1991, now U.S. Pat. No. 5,069,002, entiled "Method and Apparatus of Endpoint Detection During Mechanical Planarization of Semiconductor Wafers." CMP is used to provide a controlled removal of the composite layer 25 and barrier layer 19 and to provide a contact plug 27 having a substantially coplanar surface 28 with the dielectric layer 16. The coplanar surface 28 resulting from the CMP provides a better electrical contact with subsequently fabricated interconnect lines since the CMP eliminates any depressions in the contact plug which may result from a standard etch. Another preferred option is to perform a partial chemical etch which is stopped before the dielectric layer 16 is exposed. The CMP is then used to expose the dielectric layer 16 and the contact plug 27.

After the CMP has been performed it is necessary to clean the wafer to remove any residue formed during the CMP.

At this juncture, interconnect lines are formed to contact plug 27. The interconnect lines may be formed in the dielectric layer 16 such that they contact a vertical sidewall of the contact plug 27 or may be formed overlying the dielectric layer 16 contacting the surface 28 of contact plug 27. The former process is called damascene. The later process is preferred and is more fully described below.

Figure 9:
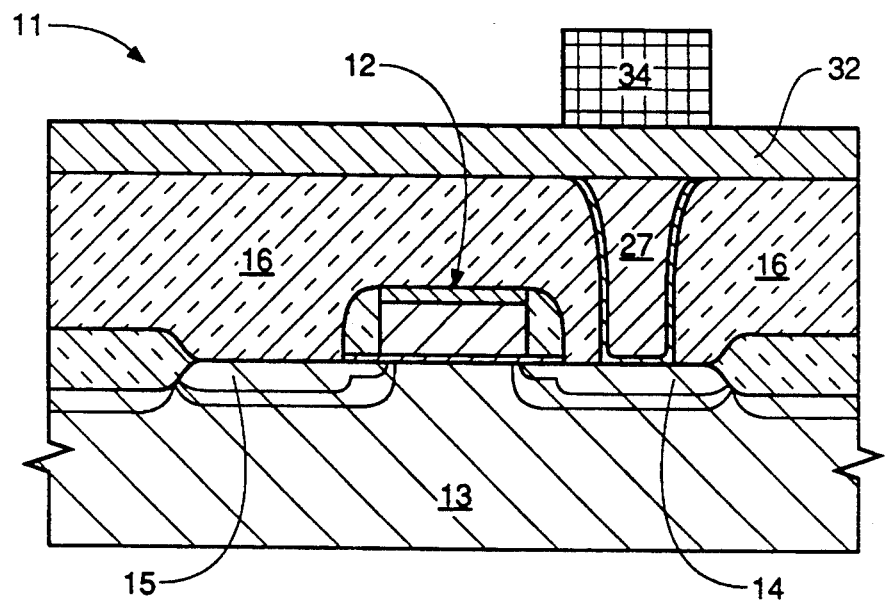
FIG. 9 is a cross sectional view of the wafer portion of FIG. 7, following a deposition of an aluminum interconnect layer and a masking of the aluminum to form the interconnect lines.

In FIG. 9 a conductive interconnect layer 32 has been deposited to overlie the dielectric layer 16 and contact plug 27. In the preferred embodiment the conductive layer 32 is an aluminum alloy comprising aluminum silicon copper, aluminum titanium, or aluminum copper. The conductive layer may also comprise other materials, such as alloys of copper, gold, titanium, or molybdenum. Although the conductive layer 32 may be deposited by any number of means, such as chemical vapor deposition or sputter deposition, sputter deposition is preferred. FIG. 9 also depicts the mask 34 overlying the conductive layer 32 and designed to provide an interconnect line contacting the contact plug 27.

Figure 10:
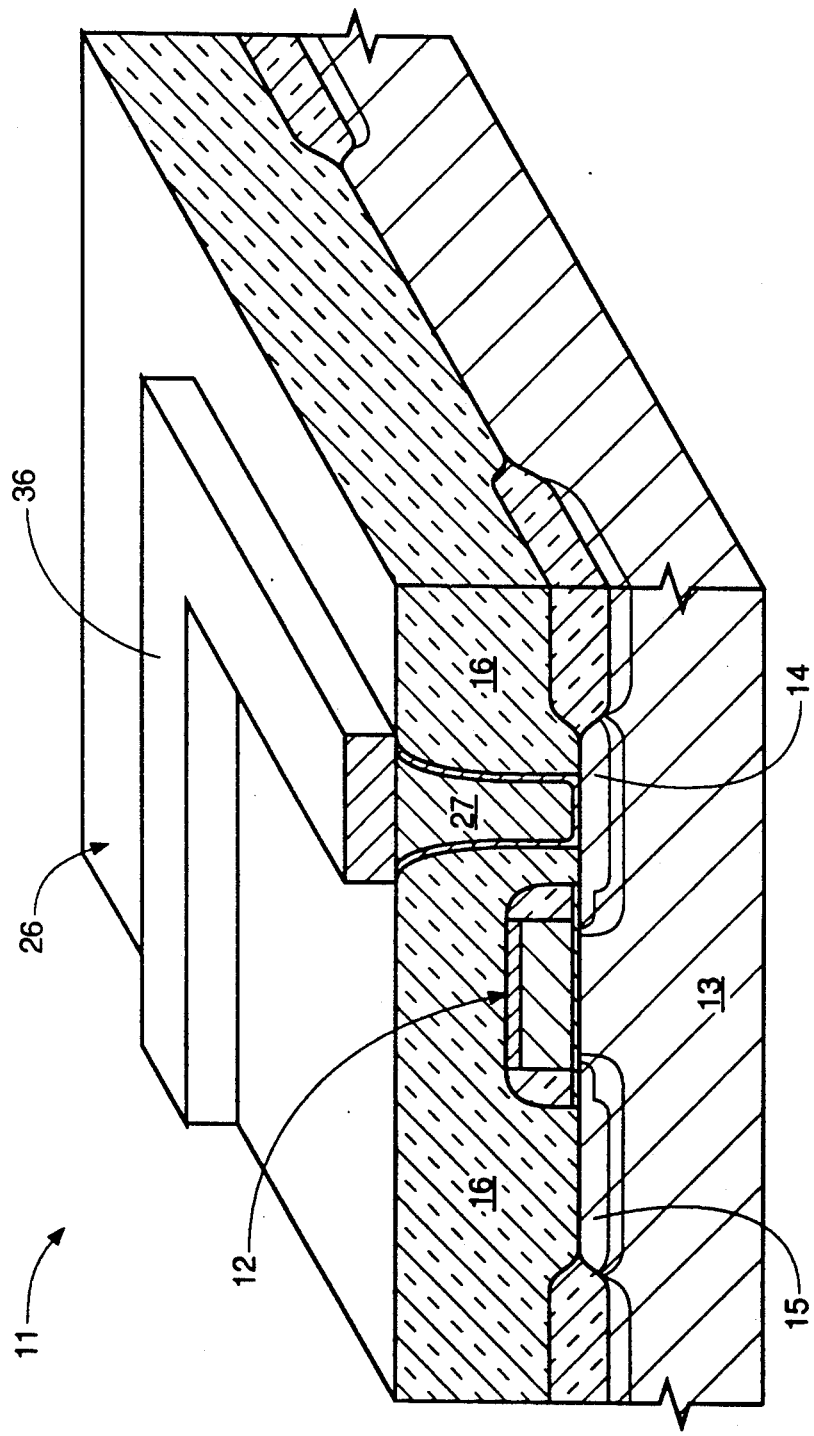
FIG. 10 is an isometric view of the wafer portion of FIG. 9, following the etch of the aluminum to form interconnect lines.

Referring to FIG. 10, the conductive layer 32 has been etched with a dry plasma chemical etch and the interconnect line 36 remains. Alternate etch methods may be used. The contact plug 27 and interconnect line 36 are in electrical contact due to the coplanar nature of the contact plug 27 formed according to the preferred embodiment of the invention.

Figure 11:
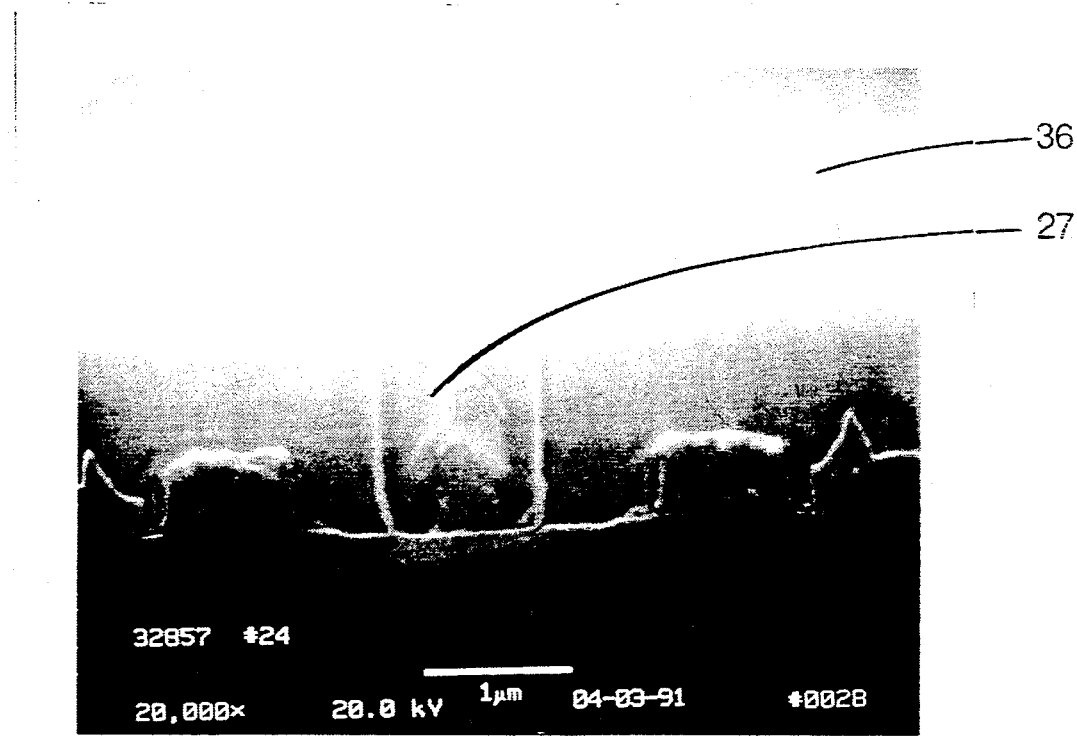
FIG. 11 is a cross sectional micrograph depicting the composite layer forming the contact plug and the interconnect line overlying the contact plug, the contact plug and interconnect line formed according to the invention.
Figure 12:
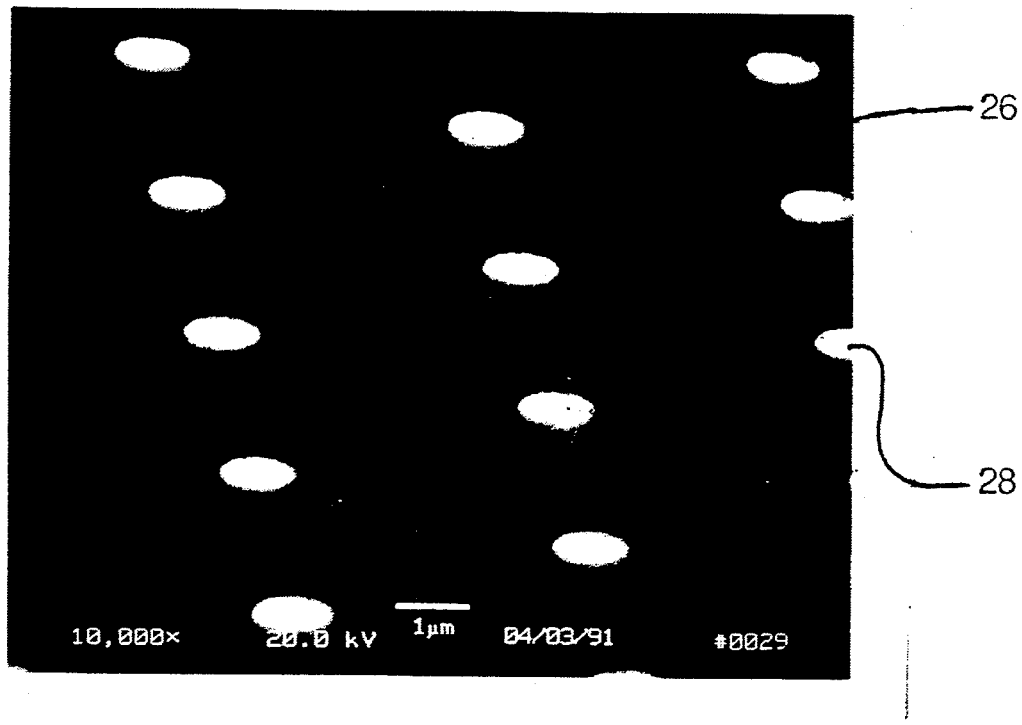
FIG. 12 is a plan view of a micrograph depicting the coplanar surfaces of the dielectric layer and contact plugs formed according to the invention.

FIGS. 11 and 12 are micrographs taken with a high resolution scanning electron microscope.

FIG. 11 is a cross sectional view of a micrograph depicting the composite layer forming the contact plug 27 and the interconnect line 36 overlying the contact plug 27; the contact plug formed according to the invention. It can be seen from FIG. 11 that the integrity of the contact plug 27 is excellent; step coverage is good and voids in the composite layer have been eliminated.

FIG. 12 is a plan view of a micrograph depicting the coplanar surface 26 of the dielectric layer and the surfaces 28 of the contact plugs formed according to the invention.

FIGS. 11 and 12 also depict the substantially coplanar nature of the surface 28 of the contact plugs with the surface 26 of the dielectric layer. The interconnect line 36 shown in FIG. 11 is in good electrical contact with the contact plug 27.

Although only several embodiments of the invention have been described herein, it will be apparent to one skilled in the art that changes and modifications may be made thereto without departing from the spirit and the scope of the invention as claimed.

We claim:

1. A method for substantially filling a cavity comprising:
   a) depositing a material in at least the cavity;
   b) subsequent to said step of depositing said material in the cavity, subjecting said material to laser energy such that said material attains a liquid state; and
   c) discontinuing said subjection of said material to laser energy.

2. The method of claim 1, further comprising forming the cavity in a workpiece, the cavity capable of receiving and containing said material.

3. The method of claim 1, further comprising removing an excess of said material from said workpiece such that said material is substantially confined to the cavity.

4. The method of claim 3, wherein said removing is accomplished using mechanical energy.

5. The method of claim 3, wherein said removing is accomplished using chemical energy.

6. The method of claim 3, wherein said removing is accomplished using a combination of mechanical and chemical energy.

7. The method of claim 1, wherein said step of discontinuing results in said material solidifying.

8. The method of claim 1, further comprising using a protective barrier to prevent an interaction between said deposited material and said workpiece.

9. A method for forming a contact plug comprising:
   a) depositing a material in a contact hole;
   b) subsequent to said step of depositing said material in said contact hole, subjecting said material to laser energy such that said material attains a liquid state; and
   c) discontinuing said subjection of said material to laser energy, said method forming said contact plug of said material in at least a portion of said contact hole.

10. The method of claim 9, comprising forming a contact hole in a workpiece in order to expose a contact region, said contact hole having at least one sidewall contacting said contact region, said contact hole and said contact region capable of receiving and containing said material, said contact plug being in substantial contact with said contact region.

11. The method of claim 9, wherein said subjection of said material to laser energy liquifies said material.

12. The method of claim 9, wherein said discontinuation of said subjection of said material to laser energy solidifies said material.

13. The method of claim 9, further comprising removing an excess of said material from said workpiece such that said material is substantially confined to said contact hole.

14. The method of claim 13, wherein said removing is accomplished using a mechanical erosion technique.

15. The method of claim 13, wherein said removing is accomplished using a chemical erosion technique.

16. The method of claim 13, wherein said removing is accomplished using a combination of a mechanical erosion technique and a chemical erosion technique.

17. The method of claim 9, further comprising using a protective barrier layer to prevent an interaction between said deposited material and said workpiece.

18. A method for forming a contact plug in a dielectric overlying a semiconductor conductive region, comprising:
   a) masking the dielectric layer;
   b) etching a contact hole in the dielectric layer in order to expose a portion of the conductive region, said contact hole having at least one sidewall, said sidewall contacting said conductive region, said contact hole capable of receiving a material, said contact hole in conjunction with said conductive region capable of retaining said material;
   c) depositing a conductive material in at least said contact hole; and
   d) subjecting said deposited conductive material to laser energy, said laser energy imparting thermal energy to said conductive material thereby causing said conductive region and said conductive material to come into substantial contact.

19. The method of claim 18, further comprising discontinuing said subjecting of said deposited conductive material to laser energy, said discontinuing solidifying said conductive material to form the contact plug.

20. The method of claim 18, further comprising depositing a protective barrier layer on at least said sidewall prior to said depositing of said conductive material, said protective barrier layer preventing an interaction of said dielectric layer and said conductive material.

21. The method of claim 18, further comprising depositing an anti-reflective material capable of absorbing laser energy to overly said conductive material prior to said subjecting, said anti-reflective material and said conductive material forming a composite layer thermally induced by said subjecting, said composite layer being in substantial contact with said conductive region.

22. The method of claim 21, further comprising discontinuing said subjecting, said discontinuing solidifying said composite layer to form said contact plug.

23. The method of claim 22, further comprising blanket etching of said composite layer, said blanket etching further defining said contact plug, said contact plug having a bottom portion in substantial contact with said contact region and an upper portion substantially coplanar with a surface of said dielectric layer subsequent to said blanket etching.

24. The method of claim 18, further comprising forming a conductive interconnect line in contact with said contact plug.

25. A method for forming a contact plug in a dielectric, said dielectric overlying a semiconductor conductive region, comprising:
   a) masking the dielectric layer;
   b) etching the dielectric layer to form a contact hole and to expose a portion of the conductive region, said contact hole having at least one sidewall, said contact hole capable of receiving a material, said contact hole in conjunction with said conductive region capable of retaining a material;
   c) depositing a protective barrier layer on at least said sidewall prior to said depositing of said conductive material, said protective barrier layer preventing an interaction of said dielectric layer and said conductive material;
   d) depositing a conductive material in at least said contact hole;
   e) depositing an anti-reflective material capable of absorbing laser energy to overly said conductive material;
   f) subjecting said deposited conductive material and said deposited anti-reflective material to laser energy, said laser energy imparting thermal energy to said conductive material and said anti-reflective material, said thermal energy liquefying said conductive material and said anti-reflective material and thermally inducing said conductive material and said anti-reflective material to flow together to form a composite layer comprising said anti-reflective material and said conductive material, said composite layer being in substantial contact with said conductive region;
   g) discontinuing said subjecting, said discontinuing solidifying said composite layer to form said contact plug; and
   h) blanket etching of said composite layer, said blanket etching further defining said contact plug, said contact plug having a bottom portion in substantial contact with said contact region and an upper portion substantially coplanar with a surface of said dielectric layer.

26. The method of claim 25, further comprising forming a conductive interconnect line in contact with said contact plug.

27. The method of claim 26, further comprising removing a residue of said blanket etching prior to said formation of said conductive interconnect line.

28. The method of claim 25, wherein said depositing said conductive material, said depositing said anti-reflective material, and said depositing said protective barrier layer comprises a sputter deposit and a chemical vapor deposition.

29. The method of claim 25, wherein said protective barrier layer comprises titanium tungsten or titanium nitride.

30. The method of claim 25, wherein said conductive layer comprises aluminum, copper, gold, titanium, and molybdenum.

31. The method of claim 25, wherein said anti-reflective material comprises titanium, titanium nitride, tungsten, and tungsten nitride.

32. The method of claim 25, wherein said interconnect lines comprise alloys of aluminum, copper, gold, titanium, and molybdenum, said aluminum alloys comprising aluminum silicon copper, aluminum titanium, and aluminum copper.

33. The method of claim 25, wherein said blanket etching comprises a chemical etch, a mechanical etch, and a chemical-mechanical polishing.

34. The method of claim 33, wherein said chemical etch comprises a dry etch and a wet etch.

35. The method of claim 25, wherein said blanket etching is a combination of a chemical etch performed prior to a chemical-mechanical polishing.

36. A contact plug in a dielectric, said dielectric overlying a semiconductor conductive region, said contact plug formed by the process comprising:
   a) masking the dielectric layer;

b) etching the dielectric layer to form a contact hole and to expose a portion of the conductive region, said contact hole having at least one sidewall, said contact hole capable of receiving a material, said contact hole in conjunction with said conductive region capable of retaining a material;

c) depositing a protective barrier layer on at least said sidewall prior to said depositing of said conductive material, said protective barrier layer preventing an interaction of said dielectric layer and said conductive material;

d) depositing a conductive material in at least said contact hole;

e) depositing an anti-reflective material capable of absorbing laser energy to overly said conductive material;

f) subjecting said deposited conductive material and said deposited anti-reflective material to laser energy, said laser energy imparting thermal energy to said conductive material and said anti-reflective material, said thermal energy liquefying said conductive material and said anti-reflective material and thermally inducing said conductive material and said anti-reflective material to flow together to form a composite layer comprising said anti-reflective material and said conductive material, said composite layer being in substantial contact with said conductive region;

g) discontinuing said subjecting, said discontinuing solidifying said composite layer to form said contact plug; and h) blanket etching of said composite layer, said blanket etching further defining said contact plug, said contact plug having a bottom portion in substantial contact with said contact region and an upper portion substantially coplanar with a surface of said dielectric layer.

37. The contact plug of claim 36, further comprising forming a conductive interconnect line in contact with said contact plug.

38. The contact plug of claim 37, further comprising removing a residue of said blanket etching prior to said formation of said conductive interconnect line.

39. The contact plug of claim 36, wherein said depositing said conductive material, said depositing said anti-reflective material, and said depositing said protective barrier layer comprises a sputter deposit and a chemical vapor deposition.

40. The contact plug of claim 36, wherein said protective barrier layer comprises titanium tungsten or titanium nitride.

41. The contact plug of claim 36, wherein said conductive layer comprises aluminum, copper, gold, titanium, and molybdenum.

42. The contact plug of claim 36, wherein said anti-reflective material comprises titanium, titanium nitride, tungsten, and tungsten nitride.

43. The contact plug of claim 36, wherein said interconnect lines comprise alloys of aluminum, copper, gold, titanium, and molybdenum, said aluminum alloys comprising aluminum silicon copper, aluminum titanium, and aluminum copper.

44. The contact plug of claim 36, wherein said blanket etching comprises a chemical etch, a mechanical etch, and a chemical-mechanical polishing.

45. The contact plug of claim 44, wherein said chemical etch comprises a dry etch and a wet etch.

46. The contact plug of claim 36, wherein said blanket etching is a combination of a chemical etch performed prior to a chemical-mechanical polishing.

* * * * *

UNITED STATES PATENT AND TRADEMARK OFFICE
CERTIFICATE OF CORRECTION

PATENT NO. : 5,124,780
DATED : June 23, 1992
INVENTOR(S) : Sandhu et al

It is certified that error appears in the above-indentified patent and that said Letters Patent is hereby corrected as shown below:

Column 8, line 9, kindly delete "overly" and insert
-- overlie --.

Column 8, line 52, kindly delete "25" and insert -- 26 --.

Column 8, line 54, kindly delete "and" and insert
-- or --.

Column 8, line 56, kindly delete "and" and insert
-- or --.

Column 8, line 59, kindly delete "and" and insert
-- or --.

Signed and Sealed this

Twelfth Day of April, 1994

Attest:

BRUCE LEHMAN

Attesting Officer

Commissioner of Patents and Trademarks